(12) United States Patent
Haller et al.

(10) Patent No.: US 8,086,657 B2
(45) Date of Patent: *Dec. 27, 2011

(54) ADDER STRUCTURE WITH MIDCYCLE LATCH FOR POWER REDUCTION

(75) Inventors: Wilhelm Haller, Remshalden (DE); Rolf Sautter, Bondorf (DE); Christoph Wandel, Weil im Schoenbuch (DE); Ulrich Weiss, Holzgerlingen (DE)

(73) Assignee: International Business Machines Corporation, Armonk, NY (US)

(*) Notice: Subject to any disclaimer, the term of this patent is extended or adjusted under 35 U.S.C. 154(b) by 931 days.

This patent is subject to a terminal disclaimer.

(21) Appl. No.: 12/099,973

(22) Filed: Apr. 9, 2008

(65) Prior Publication Data

US 2008/0294706 A1 Nov. 27, 2008

Related U.S. Application Data

(62) Division of application No. 10/973,365, filed on Oct. 26, 2004, now Pat. No. 7,406,495.

(51) Int. Cl.
*G06F 7/50* (2006.01)

(52) U.S. Cl. ........................................................ 708/710
(58) Field of Classification Search ........... 708/700–714
See application file for complete search history.

(56) References Cited

U.S. PATENT DOCUMENTS

| | | | |
|---|---|---|---|
| 4,899,305 A | 2/1990 | Needles | 708/704 |
| 5,329,477 A | 7/1994 | Kudou | 708/706 |
| 5,905,667 A | 5/1999 | Lee | 708/700 |
| 5,951,631 A | 9/1999 | Hwang | 708/710 |
| 2001/0032223 A1 | 10/2001 | Hayakawa | 708/211 |

*Primary Examiner* — Tan V Mai
(74) *Attorney, Agent, or Firm* — John E. Campbell

(57) ABSTRACT

A digital adder circuit comprising a plurality of logical stages in the carry logic of said adder circuit, for generating and propagating predetermined groups of operand bits, each stage implementing a predetermined logic function and processing input variables from a preceding stage and outputting result values to a succeeding stage static and dynamic logic in the carry network of a 4-bit adder, and with output from the first stage fed directly as an input (60, 62) to the third stage of the carry network. Preferably, stages having normally relatively high switching activities are implemented in static logic. Preferably, the first stage of its carry network is implemented in a static logic, and the rest of the stages in dynamic logic.

7 Claims, 10 Drawing Sheets

AOI22 GATE: H1=NOT(A0B0
+A1B1)
STAGE 1

OAI22 GATE: I1 =
NOT((A0+B0)(A1+B1))
STAGE 1

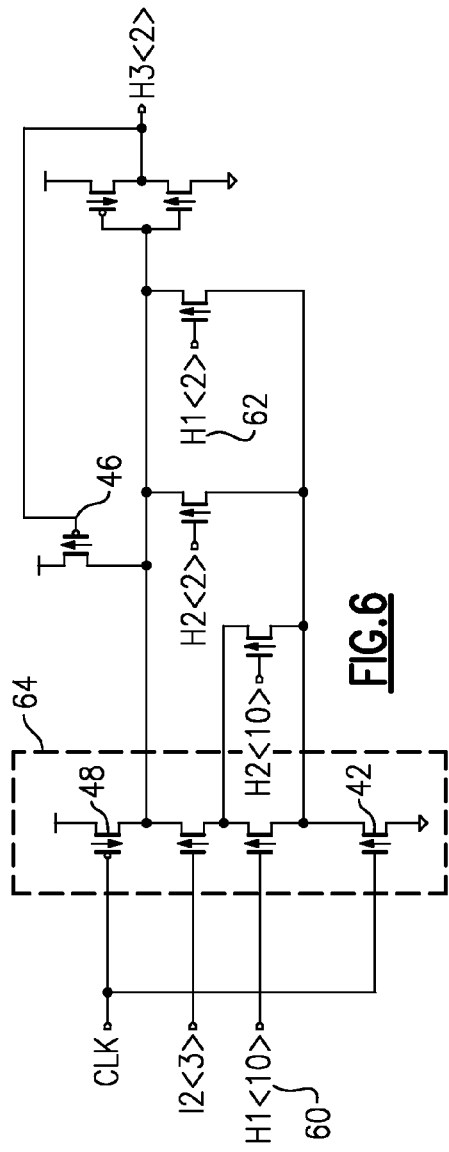
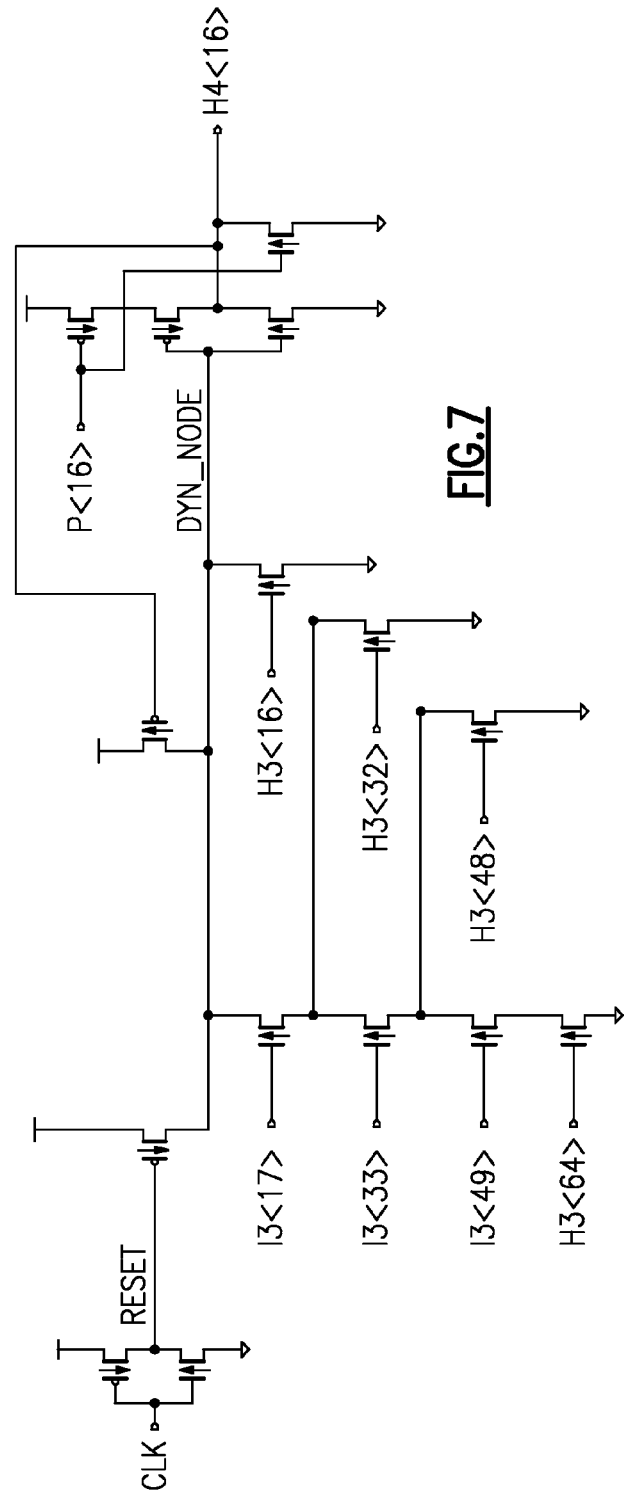
FIG.6
FIG.7

LOGIC FUNCTIONS TO GENERATE THE CARRIES FOR THE NOVEL ADDER STRUCTURE

H1(62)=G64=CYIN                I1(64)=P64=CYIN           DONE
H1(63)=G63+G64                 I1(63)=P63P64=P63CYIN     CYINTO62=B1(63)P63=(G63+G64)P63 DONE
CARRIES FOR BITS 63 TO 64 DONE WITH H1(63 TO 64)

H1(62)=G62+G63                 I1(64)=P64=CYIN           DONE
H1(61)=G61+G62                 I1(63)=P63P64=P63CYIN     CYINTO62=B1(63)P63=(G63+G64)P63 DONE

H2(62)=H1(62)+H1(64)I1(63)=G62+G63+P63CYIN
I2(62)=I1(62)I1(63)=P62P63

H2(61)=H1(61)+H1(63)I1(62)=G61+G62+(G63+G64)P62P63=G61+G62+G63P62P63+P62P63CYIN
I2(61)=I1(61)I1(63)=P61P62P63P64

H2(60)=H1(60)+H1(62)I1(61)+H1(64)I1(61)I1(63)                      I2(60)=I1(60)I1(62)I1(64)

H2(59)=H1(59)+H1(61)I1(60)+H1(63)I1(60)I1(62)                      I2(59)=I1(59)I1(61)I1(63)

H2(58)=H1(58)+H1(60)I1(59)+H1(62)I1(59)I1(61)+H1(64)I1(59)I1(61)I1(63)   I2(58)=I1(58)I1(60)I1(62)I1(64)

H2(57)=H1(57)+H1(59)I1(58)+H1(61)I1(58)I1(60)+H1(63)I1(58)I1(60)I1(62)   I2(57)=I1(57)I1(59)I1(61)I1(63)

CARRIES FOR BITS 57 TO 64 COMPLETELY DONE WITH FUNCTION H2 AND H1.

H2(56)=H1(56)+H1(58)I1(57)+H1(60)I1(57)I1(59)+H1(62)I1(57)I1(59)I1(61)    I2(56)=I1(56)I1(58)I1(60)I1(62)
H2(48)=H1(48)+H1(50)I1(49)+H1(52)I1(49)I1(51)+H1(54)I1(49)I1(51)I1(53)    I2(48)=I1(48)I1(50)I1(52)I1(54)
H2(40)=H1(40)+H1(42)I1(41)+H1(44)I1(41)I1(43)+H1(46)I1(41)I1(43)I1(45)    I2(40)=I1(40)I1(42)I1(44)I1(46)
H2(0)=H1(0)+H1(2)I1(1)+H1(4)I1(1)I1(3)+H1(6)I1(1)I1(3)I1(5)               I2(0)=I1(0)I1(2)I1(4)I1(6)

THE UNDERLIGNED H1 TERMS ARE MOVED TO THE STAGE H3. THUS THE COMPLEX GATE FOR THE H2 FUNCTION CAN BE SUPPLIED WITH A FOOT DEVICE, NOT EXCEEDING THE LIMIT OF STACKING UP N-FETS AT MOST TO THE HEIGHT OF 4 (SEE FIG. 1)

FIG.8A

H3(56)=(H1(56)+H2(56))+(H1(64)+H2(64)I2(57))           I3(56)=I2(56)I2(64)
H3(55)=(H1(55)+H2(55))+(H1(63)+H2(63)I2(56))           I3(55)=I2(55)I2(63)
H3(54)=(H1(54)+H2(54))+(H1(62)+H2(62)I2(55))           I3(54)=I2(54)I2(62)
H3(53)=(H1(53)+H2(53))+(H1(61)+H2(61)I2(54))           I3(53)=I2(53)I2(61)
H3(52)=(H1(52)+H2(52))+(H1(60)+H2(60)I2(53))           I3(52)=I2(52)I2(60)
H3(51)=(H1(51)+H2(51))+(H1(59)+H2(59)I2(52))           I3(51)=I2(51)I2(59)
H3(50)=(H1(50)+H2(50))+(H1(58)+H2(58)I2(51))           I3(50)=I2(50)I2(58)
H3(49)=(H1(49)+H2(49))+(H1(57)+H2(57)I2(50))           I3(49)=I2(49)I2(57)
CARRIES FOR BIT 49 TO 56 COMPLETELY DONE WITH FUNCTION H3

H3(48)=(H1(48)+H2(48))+(H1(56)+H2(56)I2(49))           I3(48)=I2(48)I2(56)
H3(40)=(H1(40)+H2(40))+(H1(48)+H2(48)I2(41))           I3(40)=I2(40)I2(48)

H3(0)=(H1(0)+H2(0))+(H1(8)+H2(8)I2(1))                 I3(0)=I2(0)I2(8)

THE FUNCTION H1(I) IS CONNECTED DIRECTLY FROM STAGE 1 TO STAGE 3, SHOWN IN RED,
SCHEMATIC IS SHOWN IN FIG. 2
H4(48)=H3(48)+H3(64)I3(49)
H4(47)=H3(47)+H3(63)I3(48)
H4(46)=H3(46)+H3(62)I3(47)

H4(32)=H3(32)+H3(48)I3(33)+H3(64)I3(33)I3(49)
H4(16)=H3(16)+H3(32)I3(17)+H3(48)I3(17)I3(33)+H3(64)I3(17)I3(33)I3(49)
H4(0)=H3(0)+H3(16)I3(1)+H3(32)I3(1)I3(17)+H3(48)I3(1)I3(17)I3(33)I3(49)

CY64=CYIN ............................................SUM64=HS64 XOR CY64
CY63=H1(63)P63 ...................................SUM63=HS63 XOR CY63
CY57=H2(57)P57 ...................................SUM57=HS57 XOR CY57
CY49=H3(49)P49 ...................................SUM49=HS49 XOR CY49
CY48=H4(48)P48 ...................................SUM48=HS48 XOR CY48
CY0=H4(0)P0 .........................................SUM0=HS0 XOR CY0

ADDER STRUCTURE WITH MIDCYCLE LATCH FOR POWER REDUCTION

This is a division of U.S. patent application Ser. No. 10/973,365 "Novel Adder Structure with Midcycle Latch for Power Reduction", incorporated herein by reference filed Oct. 26, 2004 now U.S. Pat. No. 7,406,495.

BACKGROUND OF THE INVENTION

1. Field of the Invention

The present invention relates to computer processors including dynamic hardware logic. In particular, it relates to a method and respective system for operating a digital adder circuit comprising a plurality of logical stages in the carry logic of said adder circuit, for generating and propagating predetermined groups of operand bits, each stage implementing a predetermined logic function and processing input variables from a preceding stage and outputting result values to a succeeding stage.

2. Description and Disadvantages of Prior Art

It is a general task for microprocessor development to make computing increasingly faster from one microprocessor generation to the next one. Additionally, there is quite a large sector of computing devices, wherein a second requirement is basically rated equally important to the computing performance, which is a low power consumption. This is specifically true for all portable devices, as for example notebooks, mobile phones, FDA devices, etc.

Adder circuits, to which the present invention is focused, occupy a critical path in many areas of microprocessor operation. Their important role for microprocessor operation is due to the fact that adder devices are present in microprocessor operation in order to operate ADD/SUB units in arithmetic logic units, for memory address generation and for floating point calculations. Thus, it is key to the cycle time, to reach a minimum delay for those adder units. In particular in CMOS hardware logic the microprocessor implementing such adder units can be clocked very high and further architectural efforts can be undertaken, in order to reach said minimum time delay and thus to increase processing speed. But by virtue of the before-mentioned second requirement, a reduced power consumption, it is worth while thinking about a useful compromise between performance and power consumption. This is specifically true when developing adder architecture as they play an important role, as stated above, and because the add operation per se is a very complicated and time-consuming operation, compared to other operations, due to the enormous carry network of an adder device. The key role for adders is even more increasing, the more important larger address spaces are needed and the longer operands are, compared, for example, to 16-bit operands to be added with two 64-bit operands to be added. The computing time needed for the 64-bit operands is basically 30% higher.

with reference back to the task of finding a good compromise between performance and power consumption so-called static CMOS logic in 64-bit ADD/SUB units can reach a delay of about 10 FO4 at some moderate power consumption. With dynamic CMOS logic the same adder can achieve a delay (latency) of about 6 fanout of 4 (FO4) inverter delays, but at about 4 times the power consumption of the above-mentioned static solution. This is specifically true for the so-called DOMINO-TYPE dynamic logic.

In prior art adder architecture the developers of adder units decide if the adder should be implemented in static logic or in dynamic logic. A static adder is slower but needs less power, whereas a dynamic adder unit is quicker, but has significantly higher power consumption. Thus, disadvantageously, prior art does not offer to find a good compromise between power consumption and adder speed other than by reducing speed in order to obtain a moderate power consumption.

A promising approach to combine static logic with dynamic logic was offered by R. Montoye et. al., "A Double precision Floating Point Multiply", ISSCC 2003, Vol. 46, pp. 336, Digest of technical papers, Visuals Supplement, pp. 270.

In this publication a first trial is offered to implement a latch at particular locations, in order to avoid the regular switching frequency to be expected in dynamic logic and thus to save power by avoiding some power consumption due to precharging the precharge nodes necessary in each cycle.

With reference to FIG. 1 (prior art), the precharge problem of prior art is shortly described next below, as it stands in a close context to the intentional approach disclosed in here.

In prior art it is known to apply so-called "keeper-devices" and/or "bleeder-devices", which try to supply charge to a precharge node temporarily or continuously, respectively. This reduces the voltage drop caused by charge sharing, but also slows down the switching of the circuit. Keeper and Bleeder devices charge the precharge node, which slows down the discharge of this node in case the logical function forces a discharge said node.

In particular, in FIG. 1 the node 40 is the above-mentioned precharge node. During the so-called reset phase it is precharged to a certain voltage level, e.g. the supply voltage Vdd. This is done by the control of the reset transistor 12, which when switched to "pass", connects the precharge node to the voltage source Vdd.

During the evaluation phase of the circuit, when some input setting is connected to the control inputs of the NFETs controlled by the input lines $A_i$, and $B_i$, these transistors remove this charge to ground, if the logic condition as defined by the value of the logic input variables A, B turns "ON", ie, to pass mode, all transistors on the path depicted between the precharged node 40 and ground terminal. If only a part of said transistors are turned "ON" without opening up a connection between the precharged node and ground, then the node has to keep its charge but must share its charge with those active transistors.

Thus, basically the bleeder device 46 and a foot transistor device, which is not depicted in FIG. 1, but which resides at the "foot" of each transistor stack (the vertical paths in FIG. 1) cooperate, in order to provide a proper precharging independent of the actual input setting of the evaluation transistor stacks.

The promising approach according to above mentioned "Montoye et al.", however, can not be transferred to 4-bit carry groups (or more) of adder units, because of the general, architectural constraint, to limit the evaluation transistor stacks of N-FET devices to a maximum number of 4 including said above mentioned foot transistor device, as the stacks would have at least 5 transistors in at least some paths of the carry network of the adder.

Thus, this hopeful approach could maybe used for 2-bit carry groups of adders, but not for 4-bit groups, which leads to a very limited applicability of this prior art static/dynamic logic combination.

OBJECTS OF THE INVENTION

It is thus an objective of the present invention to provide an adder unit, which is able to implement a better compromise between power consumption and processing speed.

SUMMARY AND ADVANTAGES OF THE INVENTION

The objective of the invention is achieved by the features stated in enclosed independent claims. Further advantageous arrangements and embodiments of the invention are set forth in the respective subclaims. Reference should now be made to the appended claims.

According to the broadest aspect of the invention, a method is disclosed for operating a digital adder circuit comprising a plurality of logical stages in the carry logic of said adder circuit, for generating and propagating predetermined groups of operand bits, each stage implementing a predetermined logic function and processing input variables from a preceding stage and outputting result values to a succeeding stage, which is characterized by the steps of:

a) operating at least one logic stage of relatively high switching activity implemented in static hardware logic and at least one logic stage of relatively low switching activity implemented in dynamic hardware logic, b) operating a predetermined stage with an input directly obtained from a stage being positioned earlier than a preceding bypass stage preceding said predetermined stage, in order to avoid input from said earlier stage into said bypass stage.

As each switching activity requires a subsequent precharge of the dynamic input node of respective dynamic hardware logic subcircuits, this enables for remarkable power reduction of the adder circuit at remarkably increased adder speed.

When this basic method further comprises the step of:
operating 4-bit groups of subsequent bit positions in the operands bit representation separately in a respective dedicated subcircuit, in which a footing device is used for enabling for efficient precharging of said dynamic hardware logic, wherein said 4-bit groups subcircuits are implemented in dynamic hardware logic using a parallel switching of stacks of CMOS N-FET transistors, wherein said stacks include a maximum of four stack members switched in series, wherein a stack member may be implemented as a single N-FET transistors or a parallel switching of at least two N-FET transistors, then this adjusts the inventional concept to the general technology convention, not to use higher stacks in said single dynamic hardware logic subcircuits than having a maximum of four members switched in series.

When this basic method further comprises the step of:
operating a latch at the output of said bypass stage for driving a subsequent stage, then a protection against crosstalk is provided.

According to an inventive principle, which is reflected in the claims, in the adder unit improved by the present invention, a combination of static hardware logic and dynamic hardware logic is implemented in an adder structure, which was already known from former ECL logic, namely the LING adder structure in a slight modification. As a person skilled in the art will appreciate the LING adder structure being based on the LING formula as described below can now be used for the objective underlying the present invention with some inventional adjustment reflecting the particular implementation difficulties in stage 2 of the total of 4 stages of the LING adder structure. First, the LING formula for the output of the 4 adder stages H1, H2, H3 and H4 of a LING adder structure implemented as a 4-bit adder having i=0 as most significant bit (MSB) is as follows:

$$H_i = G_i + G_{i+1}*P_{i+1} + G_{i+2}*P_{i+1}*P_{i+2} + G_{i+3}*P_{i+1}*P_{i+2}*P_{i+3} \quad (1)$$

$$G_i = A_i * B_i \quad (2A)$$

$$P_i = A_i + B_i \quad (2B)$$

$$H4 = A0*B0 + A1*B1*(A1+B1) + A2*B2*(A1+B1) + A3*B3*(A2+B2)*(A1+B1) \quad (3)$$

According to a basic approach of the present invention, beyond said combination between dynamic and static logic an inventional adder circuit is characterised by implementing the above formula modified in a particular way, which results in a simplification of $H_2$ formula. In particular, the $H_1$ output produced in stage 1 is not fed to stage 2, as it would be suggested by applying prior art, but instead it is directly fed to the input of stage 3 and thus bypassing stage 2 of the carry network of the LING adder.

A preferred embodiment of the invention in form of a 64-bit adder device being composed of 4 logic stages in the carry generation logic comprises further advantageously so-called LSDL latches, see for reference "J. Silbermann, et al., "A 1.0 GHz Single-Issue 64-Bit PowerPC Integer Processor," IEEE J. of Solid State Circuits, Vol. 33, No. 11, November 1998", which are incorporated to reduce further the switching activities due to precharging, as it was mentioned above. This further advantageous feature is based on the following consideration:

A latch changes its state only if the input signal switches. The first two logic stages of the adder according to LING count for about 44.8% of the logic gates of the complete adder, and about 57% of the carry logic only which may correspond to a number of 59 500 transistors having a width in the micrometer range. Stages 3 and 4 count for 44 200 transistors and stage 5 for 28 941 transistors including the result latch. Due to this distribution stage 1 and stage 2 will cause the most power consumption, when implemented in dynamic logic. Thus, it is worthwhile selecting either stage 1 or stage 2 to be implemented in static logic in order to reduce the switching activity compared to a fully dynamic adder. As it will be seen later, a preferred embodiment of the present invention implements stage 1 in static hardware and stage 2, 3, 4 and 5, which composes the sum, in dynamic hardware logic.

BRIEF DESCRIPTION OF THE DRAWINGS

The present invention is illustrated by way of example and is not limited by the shape of the figures of the drawings in which:

FIG. 6 illustrates the H3-gate of stage 3;

FIG. 7 illustrates the H4-gate of stage 4, wherein FIGS. 2 to 7 all referred to the same, preferred embodiment, FIG. 8A is a table-like representation of the logic functions for generating the carries for an inventional 64-bit adder device;

FIG. 8B is a continuation of FIG. 8A,

DETAILED DESCRIPTION OF THE PREFERRED EMBODIMENT

In the preferred embodiment described next with reference to FIGS. 2 to 7 the 4 stages of the carry generation path are described with a formula for $H1_i$, $I1_i$, $H2_i$, $I2_i$, $H3_i$, $I3_i$ and $H4_i$, $I4_i$ according to the LING formula given above, but modified according to the invention. In this preferred embodiment an inverter is implemented at the output of each stage.

Next, some formulae will be introduced. As a legend therefore, the following is valid:
+ means a logic OR,
no operator between variables, e.g. A, B, I and H, means a logic AND between them,
the variables I, H, etc. are written with indices ij, such that
Iij (i=1, 2, 3, 4 j=is a bitindex from 0 to 64)
and Hij (i=1, 2, 3, 4 i=bitindex 0 bis 64).

Figure 1:
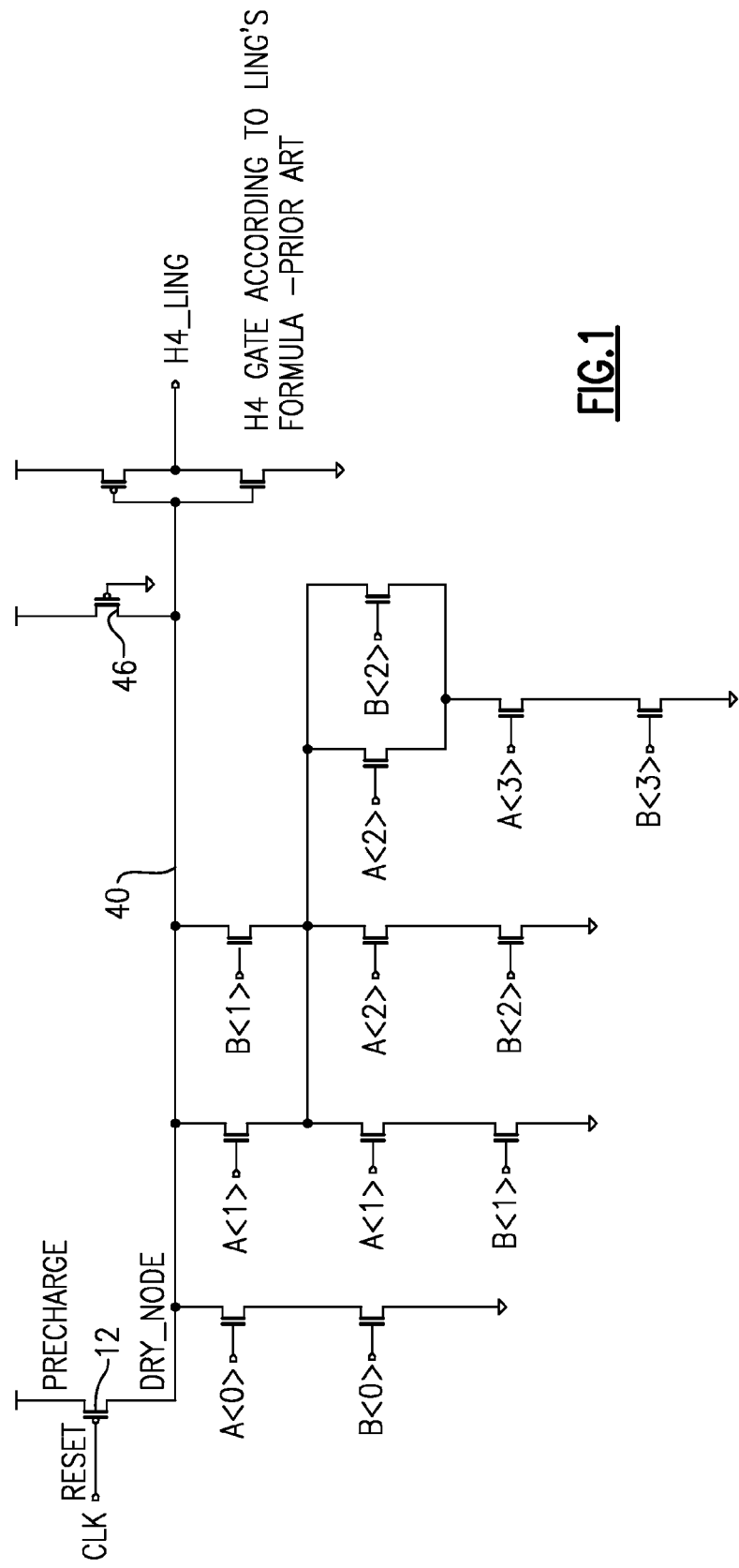
FIG. 1 is a schematic circuit diagram illustrating a H4-gate according to the above-given LING formula and representing prior art.
Figure 2:
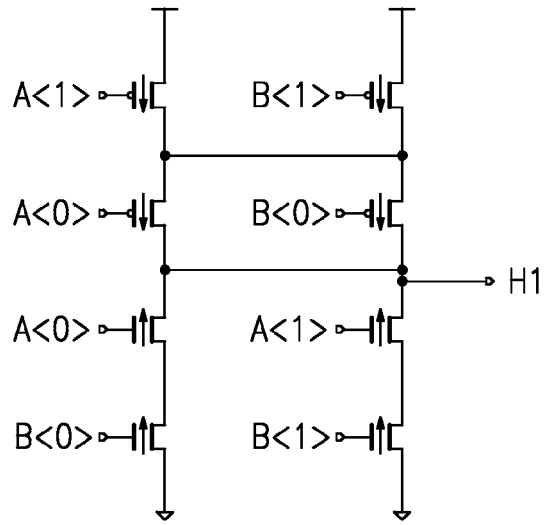
FIG. 2 is a schematic circuit diagram illustrating the H1-gate of stage 1 of an adder circuit according to a particular, preferred embodiment of the present invention.

With particular reference to FIG. 2 the formula (4A) for stage 1 is implemented in a AOI-gate:

$$H1_i = \overline{g_i + g_{i+1}} = \overline{A_i B_i + A_{i+1} B_{i+1}} \quad (4A)$$

The input variables A0, A1 and B0, B1 are switched according to above-formula 4A, and H1 results at the output of the circuit as: H1=not (A0*B0+A1*B1).

According to this preferred embodiment this first stage is implemented in static CMOS logic.

Figure 3:
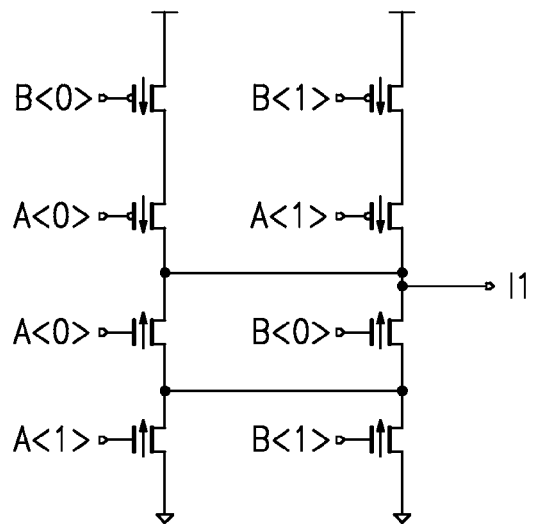
FIG. 3 illustrates the I1-gate of stage 1.

With reference to FIG. 3 the I1-gate of stage 1 implements the formula 4B:

$$I1_i = \overline{p_{i-1} p_i} = \overline{(A_{i-1} + B_{i-1})(A_i + B_i)}$$

This OAI (OR-AND-Inverted) implements I1=not ((A0+B0) (A1+B1)), also in static logic.

With further reference to FIG. 4 the H2-gate for stage 2 is implemented according to the formula 5A:

$$H2_i = \overline{H1_i + H1_{i+2} I1_{i+1} + H1_{i+4} I1_{i+1} I1_{i+3} + H1_{i+6} I1_{i+1} I1_{i+3} I1_{i+5}}$$

With reference to FIG. 5 the I2-gate of stage 2 is implemented according to the formula 5B:

$$I2_i = \overline{I1_i + I1_{i+2} + I1_{i+4} + I1_{i+6}}$$

The stage 2 is implemented as a complex dynamic logic of the DOMINO-TYPS with a LSDL latch (4) generating H2.

As the output signals from the previous stage 1 are inverted, the inverted signals have to be used in the formula (5A'):

$$H2_i = \overline{\overline{H1_i} + \overline{H1_{i+2}} \overline{I1_{i+1}} + \overline{H1_{i+4}} \overline{I1_{i+1}} \overline{I1_{i+3}} + \overline{H1_{i+6}} \overline{I1_{i+1}} \overline{I1_{i+3}} \overline{I1_{i+5}}}$$

after some modification you get:

$$H2_i = H1_i I1_{i+1} + H1_i H1_{i+2} I1_{i+3} + H1_i H1_{i+2} H1_{i+4} I1_{i+5} + H1_i H1_{i+2} H1_{i+4} H1_{i+6}$$

As the output signals from the previous stage 1 are inverted, the inverted signals have to be used in the formula (5B'):

$$I2_i = \overline{\overline{I1_i} + \overline{I1_{i+2}} + \overline{I1_{i+4}} + \overline{I1_{i+6}}} = I1_i I1_{i+2} I1_{i+4} I1_{i+6}$$

According to the above-mentioned inventional feature to reduce the complexity of stage 2 and to increase the stability of the circuit for H2 the function is reduced by the term $H1_i$ to the following function and the $H1_i$-term is carried from stage 1 directly to stage 3. This function is given by the following formula 5A":

$$H2_i = \overline{\overline{H1_{i+2}} \overline{I1_{i+1}} + \overline{H1_{i+4}} \overline{I1_{i+1}} \overline{I1_{i+3}} + \overline{H1_{i+6}} \overline{I1_{i+1}} \overline{I1_{i+3}} \overline{I1_{i+5}}}$$

Figure 4A:
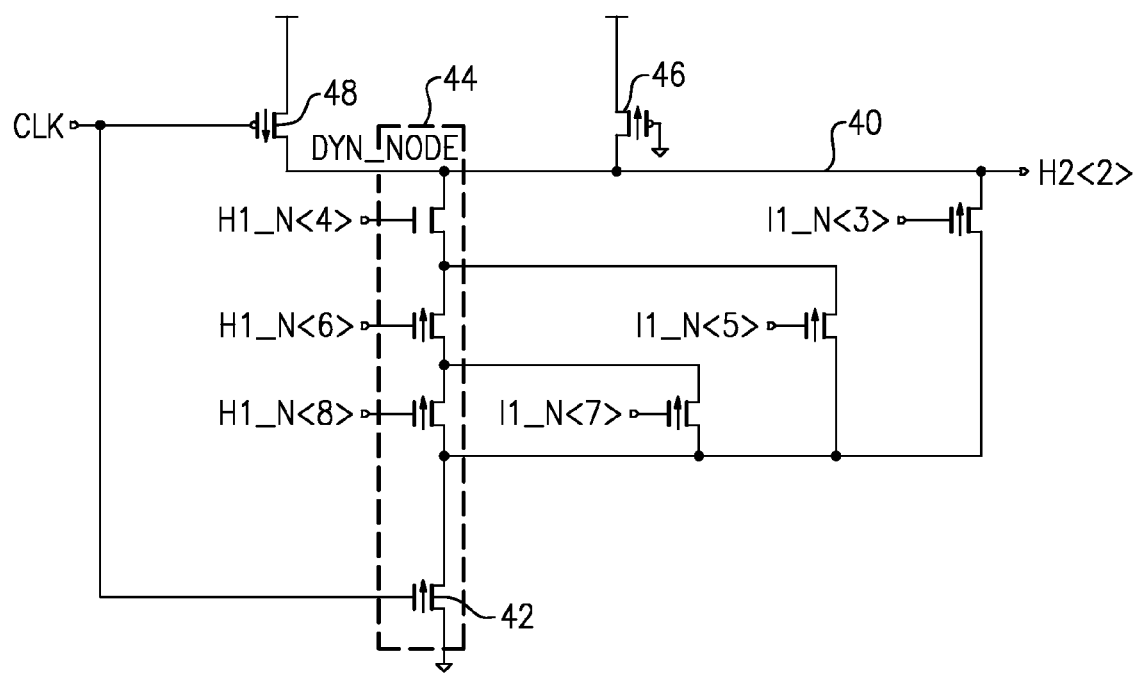
FIG. 4A illustrates the H2-gate for stage 2.

A preferred implementation thereof is given in FIGS. 4A and B, without and comprising a LSDL latch, respectively. FIG. 4A shows a preferred dynamic logic implementation of formula 5A" with a dynamic node 40, which is precharged according to prior art. Further, a foot device 42 is implemented without building a transistor stack consisting of more than 4 transistors connected in series. The 4-transistor stack is encircled by rectangle 44 depicted in dotted lines. According to the invention the transistor stack 44 can be delimited to a maximum length of 4 transistors due to the fact that the $H1_i$ input variables from stage 1 are not processed in stage 2, depicted in FIG. 4, but instead are processed in stage 3, which will be illustrated with reference to FIG. 6 further below.

Further, a bleeder device 46 is provided in order to feed the dynamic node 40 with the required amount of electrical charge. The clock signal depicted in the left upper portion of FIG. 4 resets a precharge transistor 48 which co-operates with the bleeder device 46, wherein transistor 48 and bleeder device 46 and foot device 42 are dimensioned in a suited way according to prior art, in order to implement a suited precharge mechanism. With reference to the input variables $H1\_N_i$ and $I1\_N_i$ it should be noted that _N denotes the inversion of $H1_i$ and $I1_i$ respectively.

Figure 4B:
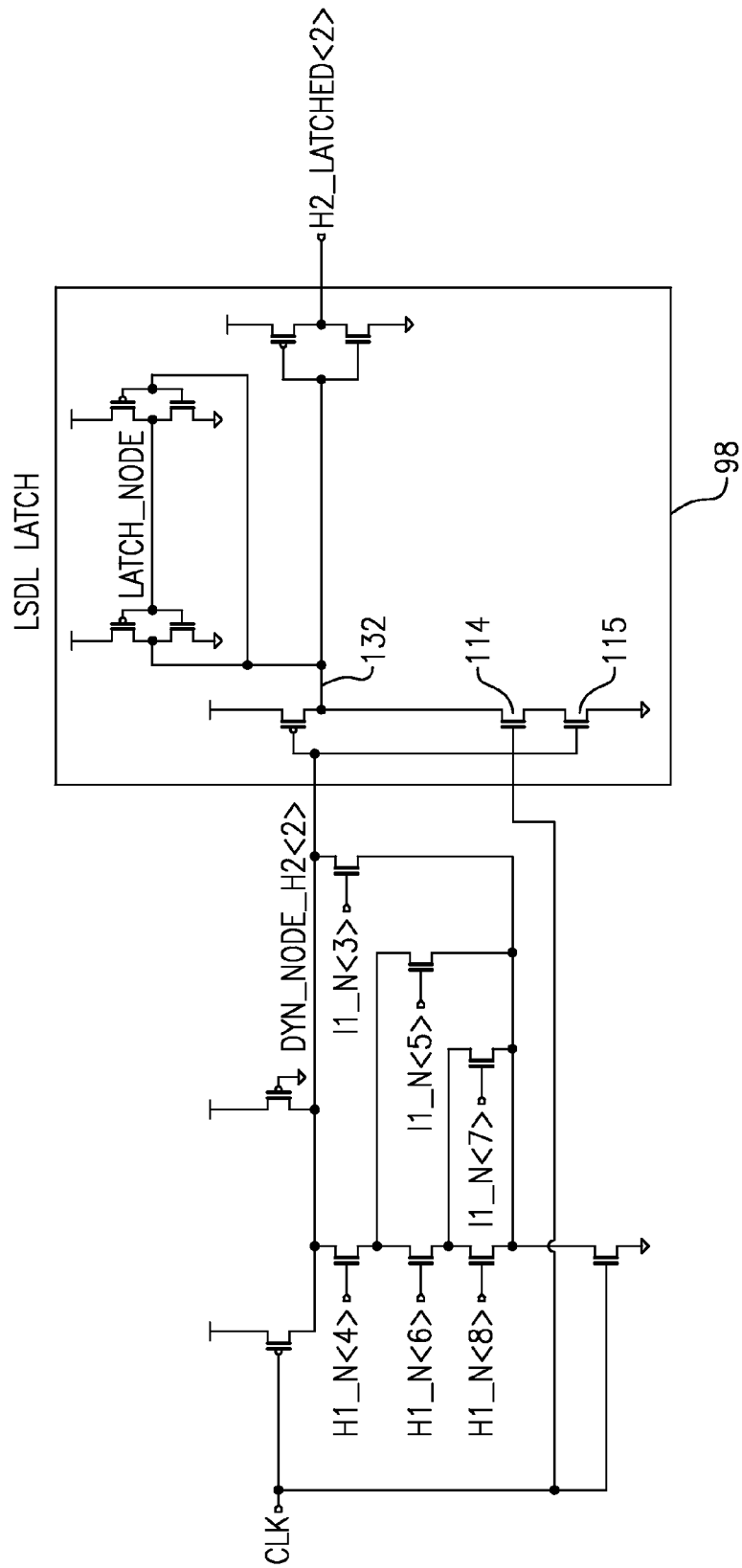
FIG. 4B illustrates the H2-gate for stage 2 with an LSDL latch according to a specific inventional feature.

With reference to FIG. 4B a LSDL latch is provided additionally relative to FIG. 4A and is depicted in a frame 98. The latch is situated at the output of the bypass stage for driving the subsequent stage, here the subsequent stage 3.

First, the latch 98 is protected for stability by output transistors against crosstalk incoming via the output line. Further, the precharge node 40 is provided as usual in dynamic logic at the input of said H1-I1 input data processing logic. In order to avoid a switching of the latch caused by a transition from precharge to evaluate phase, the timing control of transistor 14 (T14) is controlled in a particular way described further below. According to an advantageous feature of the present invention the time control of a switching transistor device 114 is implemented such that it stabilizes the bit value present on the latch input node 132 in such a way, that said transistor 114 protects the actual value of node 132, until said dynamic node 40 has a stable value during the evaluation phase. It is thus avoided, that the precharge value of said precharge node 40 can cause a switching on said latch input node 32, as transistors (114) and 115 are activated before the complex logic has reached a stable state. As a skilled person appreciates, the switching stability for the stages subsequent to this stage 2 (bypass stage) is improved.

Figure 5A:
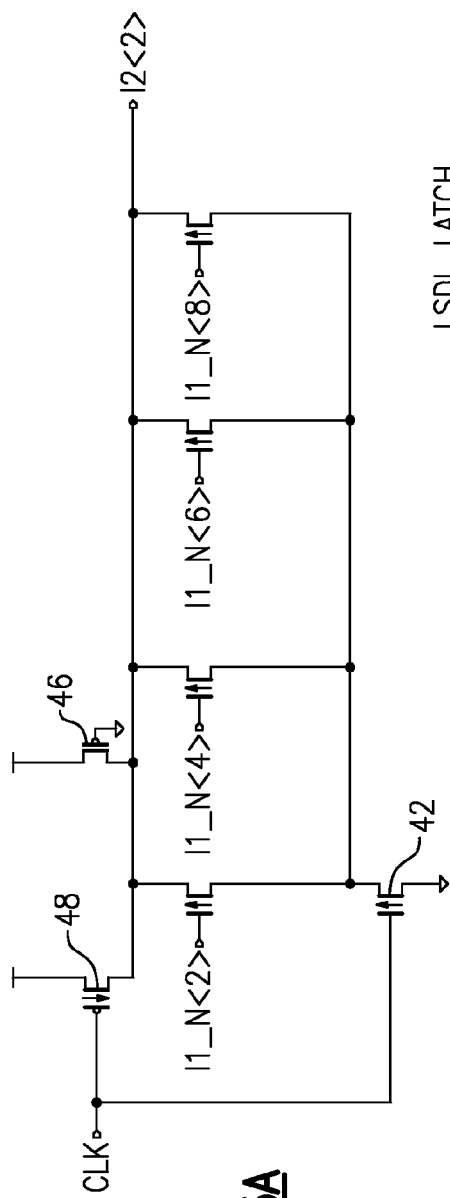
FIG. 5A illustrates the I2-gate of stage 2.

With reference to FIG. 5A the above-mentioned formula 5B' is implemented for the I2-gate of stage 2. Also here, a respective precharge mechanism is provided by a precharge transistor 48, a bleeder device 46 and a foot device 42, all implemented as N-transistor devices.

Figure 5B:
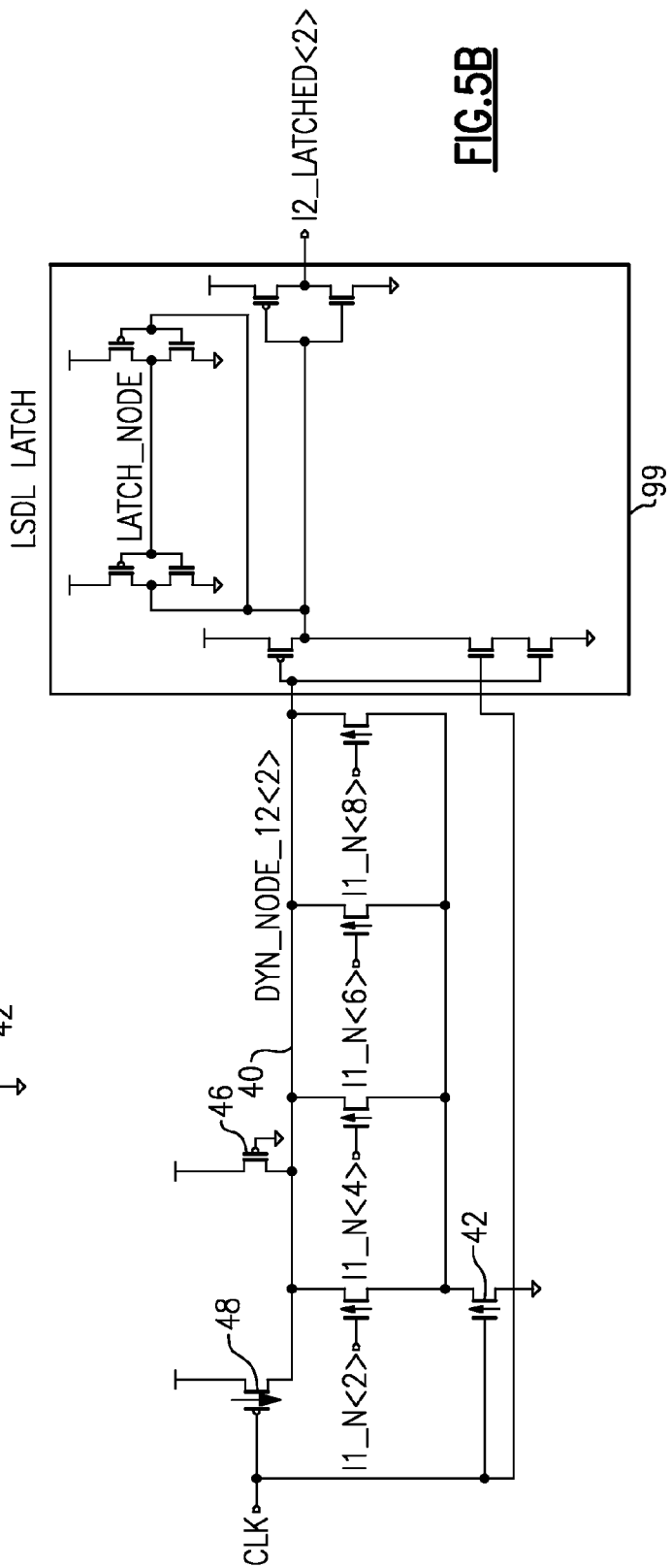
FIG. 5B illustrates the I2-gate of stage 2 with an LSDL latch according to a specific inventional feature.

With reference to FIG. 5B a LSDL latch is provided additionally relative to FIG. 4A and is depicted in a frame 99. The latch is situated at the output of the stage 2 out of similar reasons as described before.

With further reference to FIG. 6 a preferred implementation of stage 3 is depicted in a schematic way implementing in fully dynamic DOMINO-logic the H1-terms from stage 1 and H2- and I2-terms from stage 2 generating H3 and I3 according to the following formulae 6A and 6B, respectively.

$$H3_i = H1_i + H2_i + H1_{i+8}I2_{i+1} + H2_{i+8}I2_{i+1} \quad (6B)$$

$$= (H1_i + H2_i) + (H1_{i+8} + H2_{i+8})I2_{i+1}$$

$$I3_i = I2_i I2_{i+8}$$

In FIG. 6 the H1 input terms are denoted with reference signs 60 and 62, respectively. Thus, it yields that stage 2 is completely bypassed for those H1-terms. Also here, a respective precharge mechanism is provided by pre-charge transistor 48, bleeder device 46 and foot device 42. As reveals from FIG. 6 the largest transistor stack comprises not more than a number of 4 transistors including the foot device, which is indicated by the dotted line rectangle 64.

The H4-gate of stage 4 is implemented according to formula 7 and depicted in a schematic way in FIG. 7. Also these gates are implemented in fully dynamic DOMINO hardware logic.

$$H4_i=(H3_i+H3_{i+16}I3_{i+1}+H3_{i+32}I3_{i+1}I3_{i+17}+H3_{i+48}I3_{i+1}I3_{i+17}I3_{i+33})p_i \quad (7)$$

In this stage 4 blocks of 16 bits are put together in order to form the final carries for the sum generation in stage 5, not depicted separately. The terms $H_i$ together with the terms $I_i$, which is actually the propagate term of bit position $I(p_i)$ is the so-called hot carry into the next respective bit position to generate the sum Also in this stage 4 a respective precharge mechanism is implemented according to the above-described earlier stages.

Stage 5 of the carry generation network is not depicted in a drawing as it corresponds completely to prior art. In stage 5 the result sum i, the carry into bit position i and the half sum $HSUM_i$ are logically connected by an XOR-gate. Thus, the following formula 8 yields:

$$SUM_i = H4_{i-1} \oplus HSUM_i \quad (8)$$

For sake of increased completeness and clarity of the inventive approach the logic functions to generate the carries for the inventional adder structure in an example for a 64-bit adder is given in FIG. 8A and FIG. 8B, which both show a table-like representation for the functions $H_i$ and $I_i$ and the respective carries generated. The carries for bits 57 to 64 are completely done with the functions H2 and H1. Also in this representation the H1-terms marked with an arrow are moved to the stage H3. Thus, the complex gate for the H2-function can be supplied with a foot device, not exceeding the limit of stacking up N-devices for a heap higher than 4. AS it is shown in FIG. 8B the carries for bits 49 to 56 are completely done with function H3. The function H1(i) terms—denoted underligned in FIGS. 8A and 8B are connected directly from stage 1 to stage 3 thus bypassing stage 2.

Figure 9A:
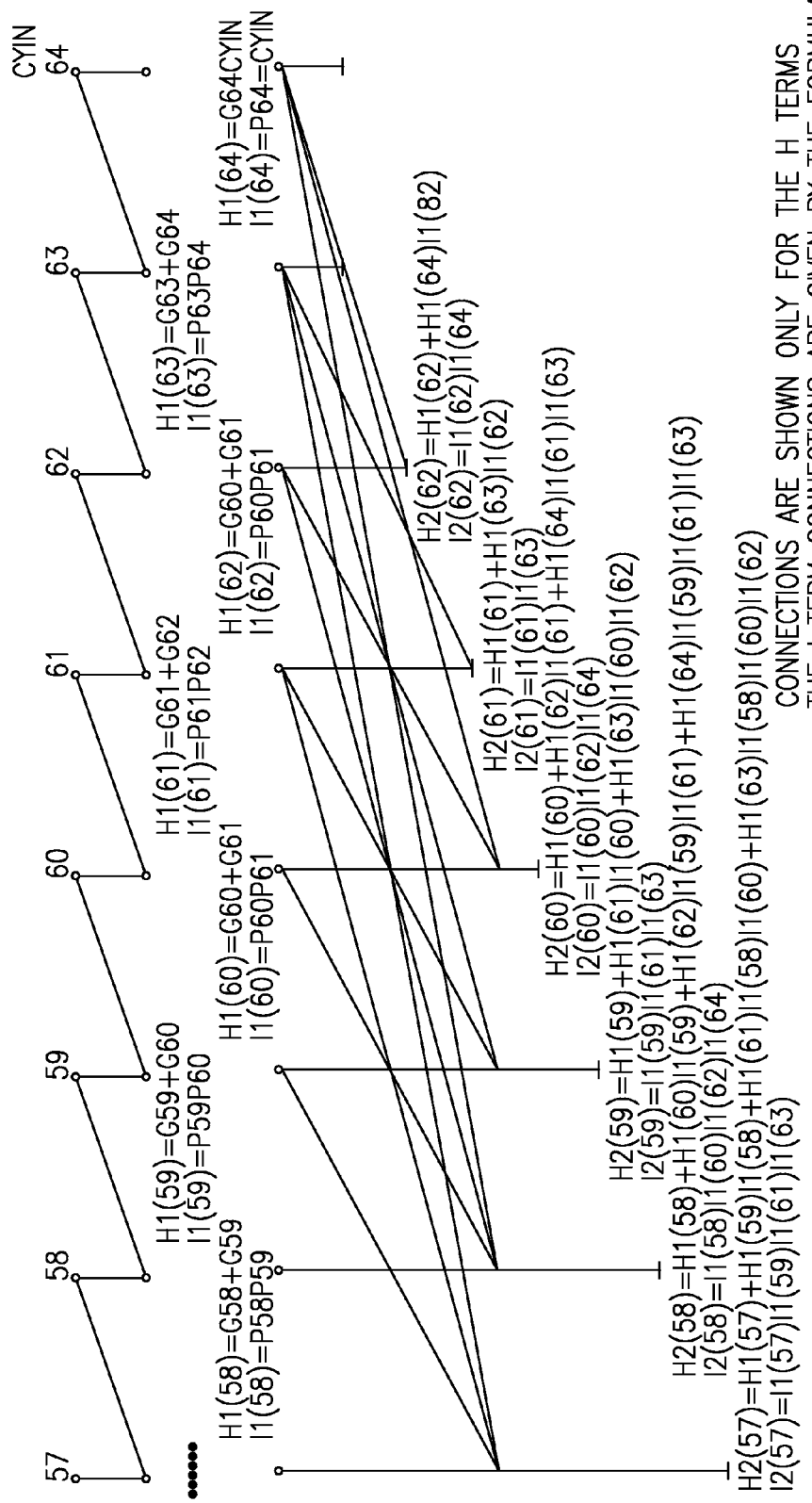
FIG. 9A is a schematic representation of a so-called parallel prefix graph of the first two levels of the inventional adder structure according to a specific embodiment thereof.
Figure 9B:
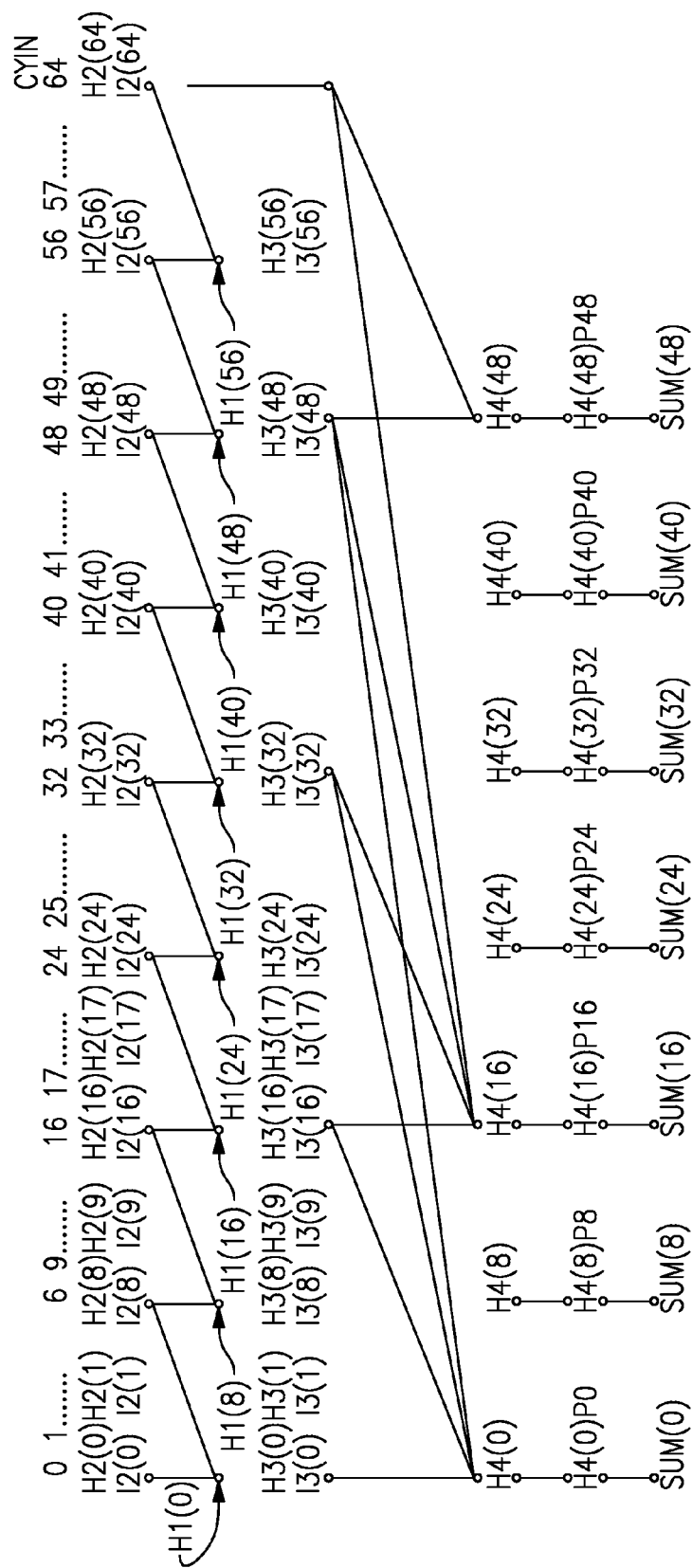
FIG. 9B is a continuation of FIG. 9A.

Further, and with reference to FIG. 9A and FIG. 9B, which is a continuation of FIG. 9A a parallel prefix graph of the first two levels of the inventional adder structure according to a specific embodiment thereof is shown. In fact, only the logical connections are illustrated as the actual implementation in silicon is different. From this schematic representation should reveal which input bits are processed in a respective stage of the carry network. In FIG. 9A the first stage of the carry network is depicted at the top portion and the second stage is depicted in the rest of the figure. In order to increase clarity the connections are shown only for the h-terms. The i-terms connections are given by the above formulae. This structure repeats itself for all 8-bit groups starting from 0 to 64.

As FIG. 9B shows there is a direct connection from stage 1 to stage 3, which is marked by arrows in the drawing.

The invention claimed is:

1. A digital adder device comprising:

a complete multiple stage digital adder circuit having at least a first, second, third and fourth stage for generating and propagating groups of operand bits, each stage implementing a predetermined logic function and processing input variables from a preceding stage and outputting result values to a succeeding stage with static and dynamic CMOS logic in a carry network, said multiple digital adder circuit implementing logic functions and processing input variables from a one stage and outputting result values to a succeeding stage of said added circuit, and, while a) at least one logic stage of relatively high switching activity is implemented in static CMOS hardware logic and at least one logic stage of relatively low switching activity implemented in dynamic CMOS hardware logic, b) a plurality of subcircuits for said multiple stage adder circuit are provided for separately operating 4-bit groups of subsequent bit positions in the operands bit representation together with a footing device (42) used for enabling for efficient precharging of said dynamic hardware logic, while said multiple stage digital adder circuit has c) a predetermined stage comprising an input (60, 62) directly coupled to a stage being positioned earlier than a preceding bypass stage to provide an output from a first stage feed directly as an input (60, 62) to a third stage of a carry network.

2. The adder device according to claim 1, wherein said 4-bit groups subcircuits are implemented in dynamic hardware logic using a parallel switching of stacks (44; 64) of CMOS N-FET transistors, wherein said stacks include a maximum of four stack members switched in series, wherein a stack member is implemented as a single N-FET transistor or a parallel switching of at least two N-FET transistors.

3. The adder device according to the preceding claim 2, including driving a subsequent stage of said digital adder circuit by operating a latch (98, 99) at the output of said bypass stage.

4. The adder device according to claim 2 wherein the first stage thereof comprises a static logic implementation of a formula:

(4a):

$$H1_i = \overline{g_i + g_{i+1}} = \overline{A_i B_i + A_{i+1} B_{i+1}}$$

and/or of a formula (4B):

$$I1_i = \overline{p_{i-1} p_i} = \overline{(A_{i-1} + B_{i-1})(A_i + B_i)}.$$

5. The adder device according to claim 4 wherein the second stage thereof comprises a dynamic logic implementation of a formula 5A" for a H2-term, and/or (5B") for a I2-term, wherein:

(5A"):

$$H2_i = \overline{H1_i + H1_{i+2} I1_{i+1} + H1_{i+4} I1_{i+1} I1_{i+3} + H1_{i+6} I1_{i+1} I1_{i+3} I1_{i+5}}$$

and (5B'):

$$I2_i = \overline{\overline{I1_i} + \overline{I1}_{i+2} + \overline{I1}_{i+4} + \overline{I1}_{i+6}} = I1_i I1_{i+2} I1_{i+4} I1_{i+6}.$$

6. The adder device according to claim 5 wherein the third stage thereof comprises a dynamic logic implementation of a formula (6A) for a H3-term, and/or (6B) for a I3-term, wherein:

(6A) and (6B) are respectively:

$$H3_i = H1_i + H2_i + H1_{i+8} I2_{i+1} + H2_{i+8} I2_{i+1}$$
$$= (H1_i + H2_i) + (H1_{i+8} + H2_{i+8}) I2_{i+1}$$
$$I3_i = I2_i I2_{i+8}.$$

7. The adder device according to claim 6 wherein the fourth stage thereof comprises a dynamic logic implementation of a formula:

(7):

$$H4_i = (H3_i + H3_{i+16} I3_{i+1} + H3_{i+32} I3_{i+1} I3_{i+17} + H3_{i+48} I3_{i+1} I3_{i+17} I3_{i+33}) p_i$$

* * * * *